(12) United States Patent
Yasuda et al.

(10) Patent No.: US 8,837,777 B2
(45) Date of Patent: Sep. 16, 2014

(54) WAFER DETECTING APPARATUS (75) Inventors: Katsumi Yasuda, Ise (JP); Toshio Kamigaki, Toyohashi (JP); Takumi Mizokawa, Osaka (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 158 days.

(21) Appl. No.: 13/468,353

(22) Filed: May 10, 2012

(65) Prior Publication Data

US 2012/0281875 A1 Nov. 8, 2012

Related U.S. Application Data (63) Continuation of application No. PCT/JP2010/070283, filed on Nov. 15, 2010.

(30) Foreign Application Priority Data

Nov. 17, 2009 (JP) .................................. 2009-262020

(51) Int. Cl.
*G06K 9/00* (2006.01)
*H01L 21/67* (2006.01)

(52) U.S. Cl.
CPC ................................. *H01L 21/67265* (2013.01)
USPC ........................................................ 382/103

(58) Field of Classification Search
CPC ............................................... H01L 21/67265
USPC ........................................................ 382/103
See application file for complete search history.

(56) References Cited

U.S. PATENT DOCUMENTS

| | | | | |
|---|---|---|---|---|
| 6,636,626 | B1 * | 10/2003 | Yoo et al. | 382/151 |
| 6,914,233 | B2 | 7/2005 | Kitazawa et al. | |
| 2005/0035313 | A1 * | 2/2005 | Garssen et al. | 250/559.33 |

FOREIGN PATENT DOCUMENTS

| | | |
|---|---|---|
| JP | 11-243130 A | 9/1999 |
| JP | 2000-68360 A | 3/2000 |
| JP | 2001-93964 A | 4/2001 |
| JP | 2002-527897 | 8/2002 |
| JP | 2003-282675 | 10/2003 |
| JP | 2010-232560 | 10/2010 |
| JP | 2010-232561 | 10/2010 |
| WO | WO 99/38207 A1 | 7/1999 |

* cited by examiner

*Primary Examiner* — Tom Y Lu
(74) *Attorney, Agent, or Firm* — Oblon, Spivak, McClelland, Maier & Neustadt, L.L.P.

(57) ABSTRACT

A wafer detecting apparatus detects storage states of a plurality of wafers stored in a wafer container. The plurality of wafers are stored substantially horizontal in slots in the wafer container to be transferred in and out of a front opening of the wafer container. The wafer detecting apparatus includes a vertically extending illumination device that emits light through the front opening onto the plurality of wafers and an imaging device that receives the light reflected from the plurality of wafers. The imaging device is arranged substantially directly in front of the wafer container and the illumination device is arranged in at least one of left and right sides of the imaging device.

17 Claims, 9 Drawing Sheets

WAFER DETECTING APPARATUS

CROSS-REFERENCE TO RELATED APPLICATION

This application is a continuation application of International Application No. PCT/JP2010/070283, filed Nov. 15, 2010, the entire content of which is incorporated herein by reference. PCT/JP2010/070283 claims priority to JP 2009-262020, filed Nov. 17, 2009, the content of which is also incorporated herein by reference.

TECHNICAL FIELD

The present disclosure relates to a wafer detecting apparatus for detecting, in a wafer storing container adapted to store a plurality of wafers, the storage state of the plurality of wafers stored therein.

BACKGROUND ART

Wafer storing containers have been traditionally used that store a plurality of wafers in slots provided therein and permit the stored wafers to be unloaded from or reloaded into the container through a forward opening.

Such a wafer storing container is transported by a robot and placed on an opening/closing device (hereinafter referred to as the load port) adapted to open or close the lid of the wafer storing container. This load port is an additional device attached, for example, to a wafer treatment apparatus adapted to perform a predetermined treatment of the wafers.

Incidentally, there are three anomalous states in which the wafers stored in the wafer storing container may be. The first anomalous state is a missing wafer in a slot. Further, the second anomalous state is a plurality of wafers stacked one on top of the other in a slot. Still further, the third anomalous state is a wafer stored in a slanting position in uneven slots, i.e., a so-called cross-slotted wafer.

A robot attempting to take out a wafer in one of the above three states is unable to do so unless the robot knows the state in which the wafer is. For this reason, robots having a wafer detecting apparatus adapted to detect the storage state of wafers have been proposed in related arts (refer, for example, Patent Documents 1 and 2).

The wafer detecting apparatus disclosed in Patent Document 1 is a light-transmitting apparatus having a transmitter on the right or left side of wafers to shine light and a receiver on the other side to receive light shined from the transmitter. Therefore, if light from the transmitter which would otherwise reach the transmitter is blocked by the wafers, it is possible, by detecting the vertical width of blocked light, to verify that wafers are stacked one on top of the other and that a wafer is cross-slotted. Further, if there is an area where light is not blocked at all, it is possible to verify that there is a missing wafer in a slot.

Incidentally, a wafer may bend or warp by its own weight when thermally treated during semiconductor manufacturing. If such a deformed wafer is detected by the light-transmitting wafer detecting apparatus disclosed in Patent Document 1, the wafer may be erroneously detected as a plurality of wafers stacked one on top of the other as described above because of a larger vertical width of blocked light despite the fact that there is only one wafer. It should be noted that the larger the size of a wafer (e.g., 300 mm to 450 mm), the further more often the above erroneous detection will Occur.

For this reason, a light-reflecting detecting apparatus disclosed in Patent Document 2 has been proposed that is designed to detect reflected light from a wafer that has struck the edge surface of the wafer rather than detecting transmitted light as described above so as to ensure high accuracy in the detection of the deformed wafer. This detecting apparatus has an illumination light source at the upper area of a detecting head and an imaging device at the lower area thereof. Therefore, light from the illumination light source is shined on the edge surface of a wafer, and reflected light from the edge surface is imaged by the imaging device. This makes it possible to positively detect not only a missing wafer and a plurality of wafers stacked one on top of the other but also a cross-slotted wafer described above even in the event of bending or warping of a wafer described above. However, this detecting apparatus has three drawbacks described below.

PRIOR ART DOCUMENTS

Patent Documents

Patent Document 1: JP-T-2002-527897
Patent Document 2: Japanese Patent Laid-Open No. 2003-282675

SUMMARY OF DISCLOSURE

Technical Problem

These drawbacks will be described based on FIGS. 11 to 13.

Figure 11:
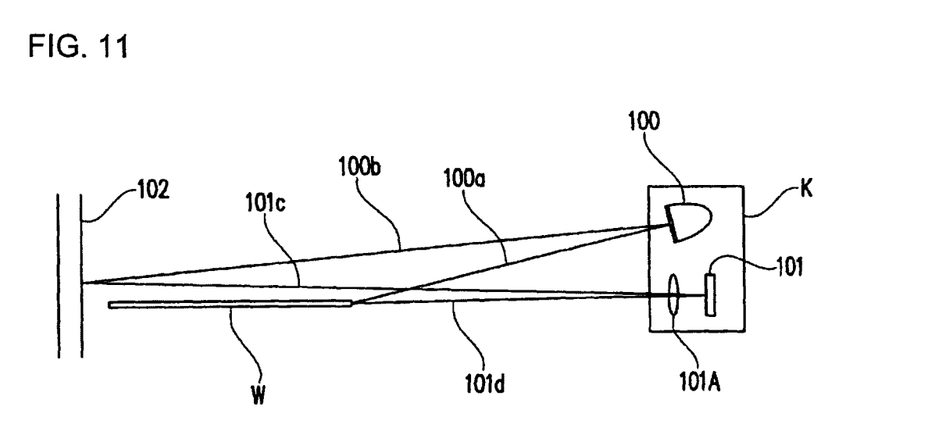
FIG. 11 is a side view illustrating two beams of light, namely, one reflected from the inner wall surface of the wafer storing container and another reflected from the edge surface of the wafer, entering the imaging device together in a conventional wafer detecting apparatus.

The first drawback is that because an illumination light source 100 is located above an imaging device 101 in a detecting head K as illustrated in FIG. 11, an optical axis 100a of the illumination light source 100 points slantingly downward. At this time, a light beam 100b other than that along the optical axis of the illumination light source 100 strikes an inner wall surface 102 of a wafer storing container and is reflected. A reflected light beam 101c thereof enters the imaging device 101 together with a reflected light beam 101d from the edge surface of a wafer W. As a result, it is impossible to detect an image of the edge surface of the wafer W. It should be noted that a projection lens 101A is arranged in front of the imaging device 101.

Figure 12:
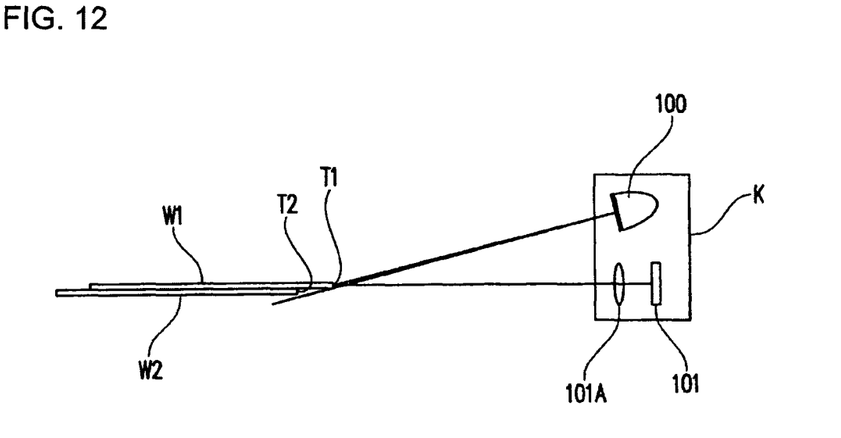
FIG. 12 is a side view illustrating the imaging of two wafers stacked one on top of the other when the upper wafer has moved and is more forward than the lower wafer in the conventional wafer detecting apparatus.

Further, the second drawback is that if, for example, a wafer W1, i.e., the upper one of the two wafers stacked one on top of the other, has moved and is even more forward (closer to the lid) than a wafer W2, i.e., the lower one thereof, due, for example, to vibration caused by the opening of the lid of the wafer storing container as illustrated in FIG. 12, it is possible to allow light from the illumination light source 100 to strike an edge surface T1 of the upper wafer W1, but not an edge surface T2 of the lower wafer W2 because the front side portion of the upper wafer W1 is in the way. As a result, it is impossible to detect the stacking of a plurality of wafers one on top of the other.

Figure 13:
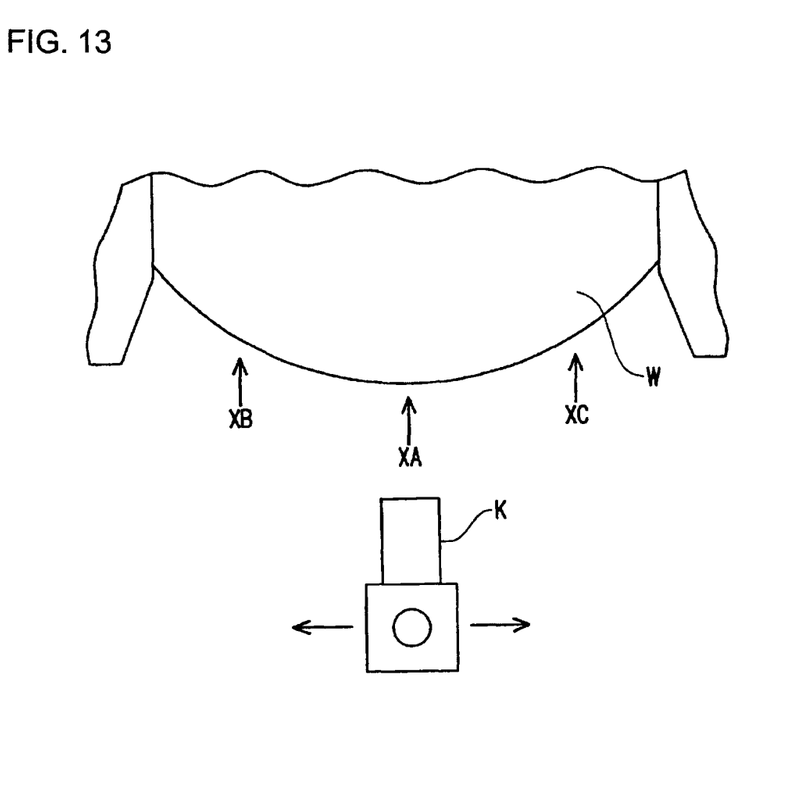
FIG. 13 is a side view illustrating the imaging of a wafer from right in front thereof in the conventional wafer detecting apparatus.

Still further, the third drawback is that because the illumination light source (not shown) provided in the detecting head K shines light in an XA direction from the front of the wafer W as illustrated in FIG. 13, it is not possible to shine light in XB and XC directions on both sides of the wafer W. Therefore, the size of area that can be imaged by the imaging device provided in the detecting head K is small, being limited to an area in the vicinity of the horizontal center portion of the wafer W. This makes it more likely that the imaging device may be affected, for example, by partial stains on the wafer. This also makes it difficult to detect a cross-slotted wafer. It should be noted that although the wafer can be imaged at a plurality of horizontal locations by moving the illumination light source and imaging device horizontally in FIG. 13 so as to positively detect a cross-slotted wafer, this leads to not only a complicated overall configuration of the apparatus but also a longer detection time, thus making this approach far from feasible.

The present disclosure has been made in light of the foregoing, and it is an object of the present disclosure to provide a wafer detecting apparatus capable of detecting the storage state of wafers accurately.

Technical Solution

That is, in order to solve the above problem, a wafer detecting apparatus according to the present disclosure is designed to detect, in a wafer storing container adapted to store a plurality of wafers, the storage state of the plurality of wafers stored therein. The wafer storing container can store a plurality of wafers stacked vertically one above the other and allows the stored wafers to be unloaded from or reloaded into the container from the front. The wafer detecting apparatus includes a vertically long illumination device adapted to shine light on the wafers stored in the wafer storing container and an imaging device adapted to receive reflected light from the wafers that has been emitted from the illumination device and struck the wafers. The imaging device is arranged in front of the wafer storing container. The illumination device is arranged on at least either the left or right side of the imaging device.

In the above configuration, the illumination device is arranged on at least either the left or right side of the imaging device, and the imaging device is arranged in front of the wafer storing container. Therefore, the optical axes of the illumination device and imaging device are not aligned in the same direction. This makes it possible to prevent two beams of light, namely, one emitted from the illumination device and reflected from the inner wall surface of the wafer storing container and another emitted from the illumination device and reflected from the edge surface of the wafer, from entering the imaging device together. That is, the drawback shown in FIG. 11 can be resolved.

Moreover, the illumination device is vertically long, making it possible to shine light vertically over a predetermined area. As a result, even if the upper one of the two wafers stacked one on top of the other has moved and is more forward (closer to the lid) than the lower one thereof, it is possible to allow light to strike these two wafers vertically. Therefore, it is possible to allow light to positively strike the edge surfaces of both the upper and lower wafers that are stacked one on top of the other. This permits positive detection of a plurality of wafers stacked one on top of the other. That is, the drawback shown in FIG. 12 can be resolved.

Still further, light is shined on the edge surface of at least either one of the left and right sides of the wafer by the illumination device arranged on at least either the left or right side of the imaging device so as to image the edge surface of at least one of the two sides of the wafer. This provides, in the event of cross-slotting of a wafer, wafer images showing that the horizontal inclination of the wafer on the right and/or left side is significantly different from that at the center. As a result, it is possible to positively detect a cross-slotted wafer based on at least one of the wafer images on the right and left sides. That is, the drawback shown in FIG. 13 can be resolved.

Still further, using the light-reflecting wafer detecting apparatus allows for wafer detection without causing any problems even in the event of bending or warping of a wafer.

As for the size of area on which light is to be shined, the illumination device may shine light vertically on the edge surfaces of all the wafers. Alternatively, the size of area may be only large enough for light to be positively shined on the edge surfaces of two possibly stacking wafers in order to ensure positive detection of the stacking of a plurality of wafers one on top of the other. It should be noted that if the illumination device shines light on the edge surfaces of only some of the wafers, it is preferred that the illumination device and imaging device should rise or lower in an integral fashion for imaging. Further, although it is preferred that the imaging device should be arranged right in front of the wafer storing container, the same device need not necessarily be arranged right in front thereof so long as it is located between the two illumination devices, one on the right side and another on the left side. That is, the imaging device may be located at any position so long as it is arranged in front of the wafer storing container.

Advantageous Effect

The present disclosure provides a wafer detecting apparatus capable of accurately detecting the storage state of wafers thanks to an imaging device arranged in front of a wafer storing container and a vertically long illumination device arranged on at least either the left or right side of the imaging device.

BRIEF DESCRIPTION OF DRAWINGS

FIG. 3(a) is a side view thereof, and FIG. 3(b) is a plan view thereof.

DESCRIPTION OF PREFERRED EMBODIMENTS

Figure 1:
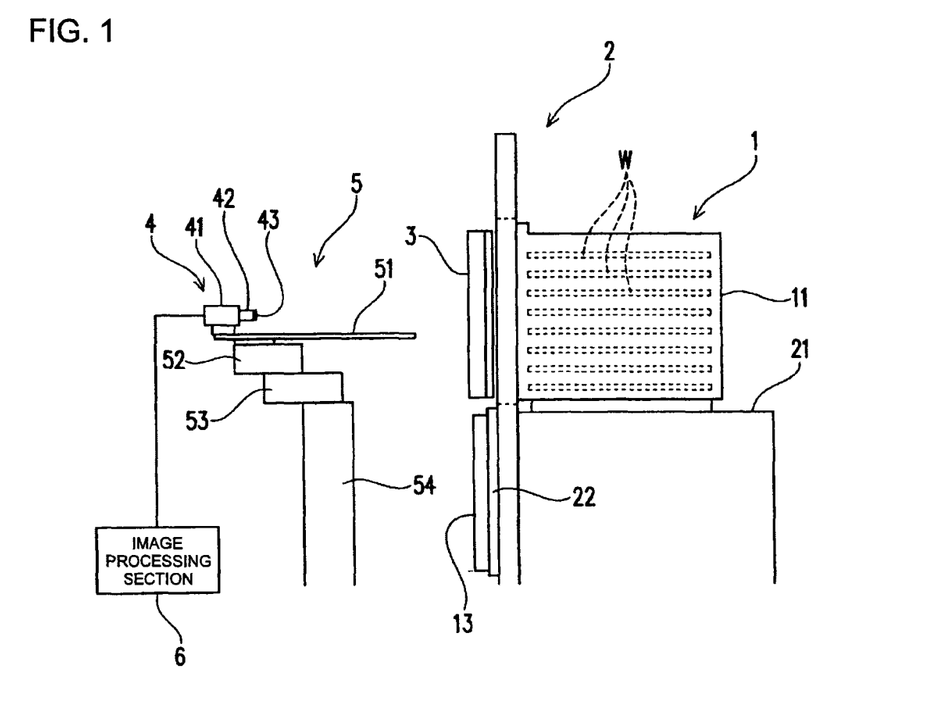
FIG. 1 is a side view of a detecting apparatus for detecting wafers in a wafer storing container placed on a load port.
Figure 2:
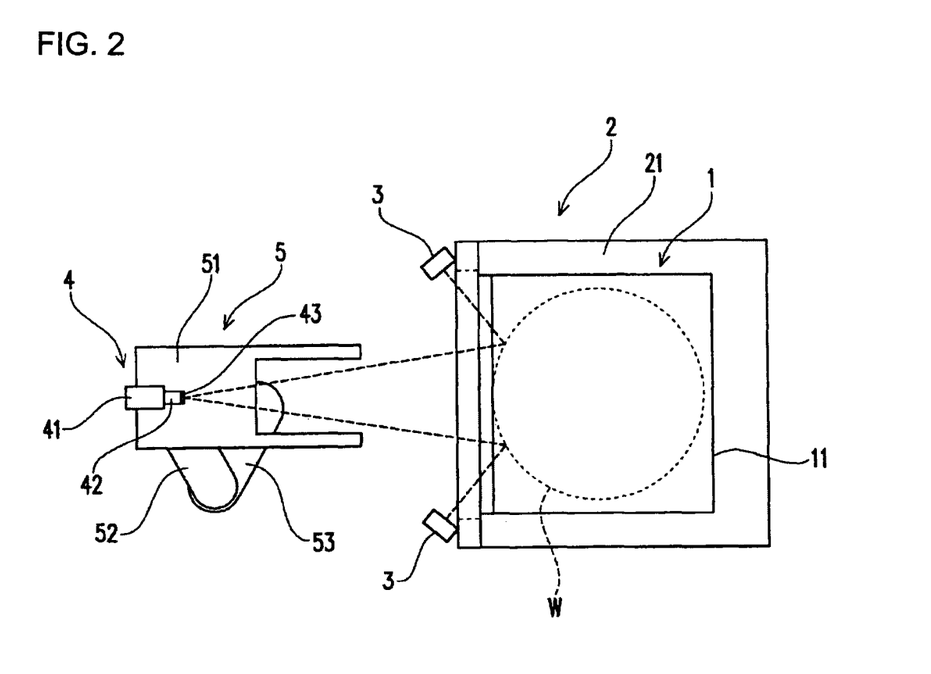
FIG. 2 is a plan view of the detecting apparatus for detecting the wafers in the wafer storing container placed on the load port.

FIGS. 1 and 2 illustrate a wafer detecting apparatus according to the present disclosure. This wafer detecting apparatus includes illumination devices 3 and imaging device 4. The illumination devices 3 are arranged, one on the right side and another on the left side of a load port 2 on which a wafer storing container 1 adapted to store the wafers W is placed. The imaging device 4 images the edge surfaces of the wafers W by receiving reflected light from the edge surfaces thereof when the illumination device 3 shines light thereon. As described above, using the light-reflecting wafer detecting apparatus allows for wafer detection without causing any problems even in the event of bending or warping of a wafer.

The wafer storing container 1 includes an enclosure 11, a number of slots 12 (refer to FIG. 5(a)) and a lid 13. The enclosure 11 is open on the front. The slots 12 are designed to store the wafers W stacked vertically one above the other with a given gap between each two adjacent wafers W. The lid 13 is designed to close an opening portion adapted to permit unloading from or reloading into the enclosure 11 from the front thereof. The enclosure 11 and lid 13 are partly or wholly made of transparent or translucent materials to view the wafers W through the enclosure 11 or lid 13. However, the enclosure 11 and lid 13 may be made of materials that do not permit viewing therethrough.

The load port 2 includes a transfer table 21 on which to place the wafer storing container 1 and an opening/closing section 22 adapted to open or close the lid 13.

The carrier robot 5 is designed to unload the wafers W from the wafer storing container 1 and reload the treated wafers W back into the same container 1 after the treatment in the unshown manufacturing apparatus. More specifically, the carrier robot 5 includes a hand 51, telescopic arms 52 and 53 and elevating shaft 54. The hand 51 grabs the wafer W. The telescopic arms 52 and 53 move the hand 51 back and forth. The elevating shaft 54 raises or lowers the hand 51 and telescopic arms 52 and 53. In the meantime, the imaging device 4 is attached on the top surface of a base end portion of the hand 51 to allow the imaging device 4 to be raised or lowered by the elevating shaft 54. Further, the imaging device 4 is connected to an image processing section 6 so that the same section can process images loaded from the imaging device 4 to produce left and right images of the wafers W as illustrated, for example, in FIG. 5(b).

Figure 3:
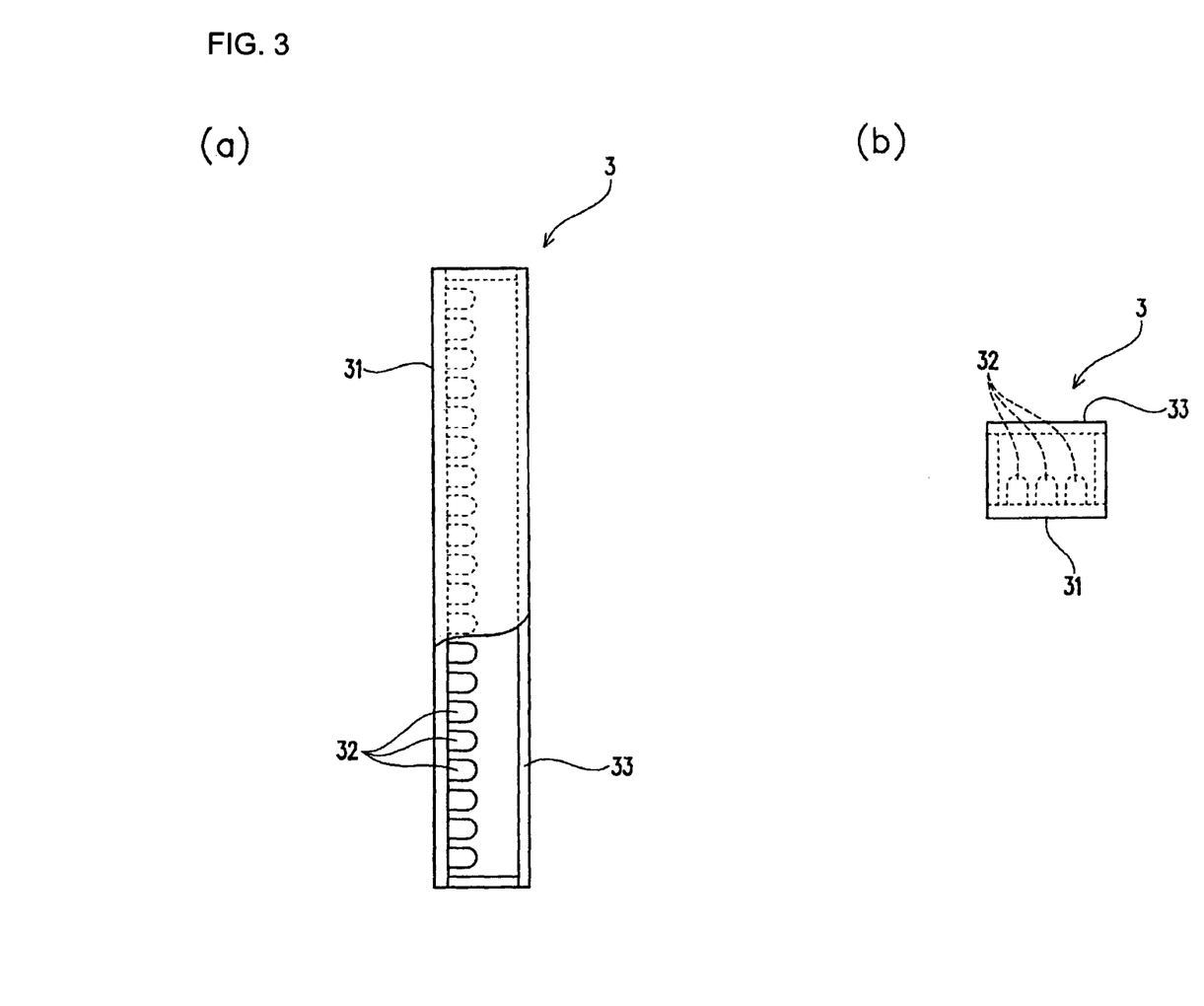
FIG. 3 illustrates an illumination device.

Each of the illumination devices 3 includes a vertically long casing 31 and many infrared LED elements 32 as illustrated in FIGS. 3(a) and 3(b). The casing 31 is long enough to span the total height of the wafer storing container 1. The infrared LED elements 32 are arranged in the casing 31. The left and right illumination devices 3 are attached respectively to the left and right sides of the load port 2 via unshown attachment members. However, the same devices 3 may be installed alone. The many infrared LED elements 32 include a total of the 60 infrared LED elements 32 that are arranged in a matrix form. A light-diffusing plate 33 is attached on the front side of the casing 31, thus forming each of the illumination devices 3 into a vertically long diffuse light source capable of shining light uniformly over the total height of the wafer storing container 1.

Referring back to FIGS. 1 and 2, the imaging device 4 includes a CCD camera 41, lens 42 and filter 43. The lens 42 is provided at the front end of the CCD camera 41 as an integral part of the same camera 41. The filter 43 is attached to the entire surface of the lens 42. The filter 43 passes the wavelengths emitted by the infrared LED elements and cuts off visible light, thus blocking or attenuating external light interference (e.g., illuminating light from the fluorescent lamps installed in the clean room) that may find its way from the enclosure 11 and ensuring that the detection of reflected light from the edge surfaces of the wafers is not hindered.

A description will be given below of the procedure for detecting the storage state of the wafers W in the wafer storing container 1 using the wafer detecting apparatus configured as described above.

First, following the opening of the opening/closing section 22 of the load port 2, the same section 22 is lowered while holding the lid 13 (refer to FIG. 1). This permits the carrier robot 5 to access into the wafer storing container 1.

Figure 4:
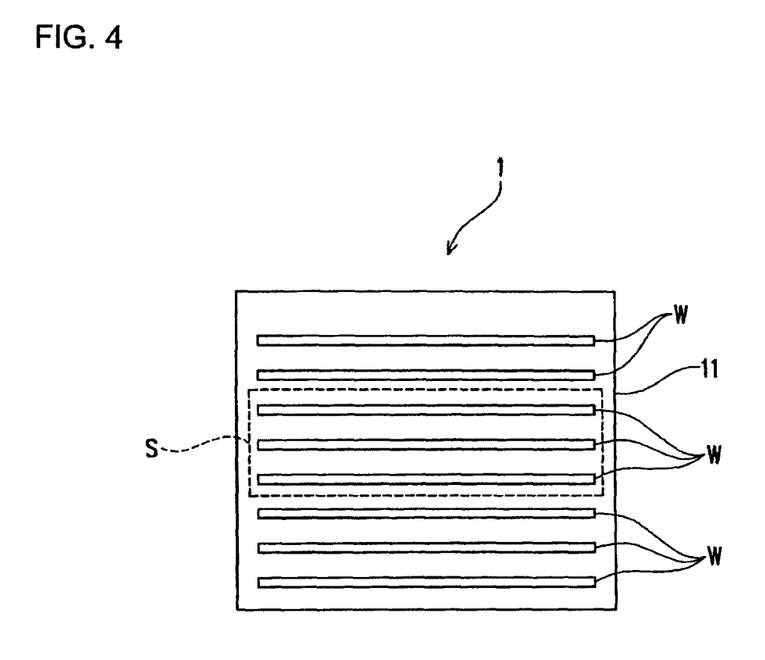
FIG. 4 is an explanatory diagram illustrating the vertical imaging area of the imaging device.

After the carrier robot 5 is permitted access, the operation begins to detect the storage state of the wafers W in the wafer storing container 1. First, the left and right illumination devices 3 are powered on to shine light on the left and right sides of the wafers W. Next, the imaging device 4 is lowered, for example, by a given distance, from the position where it faces the uppermost wafer W to that where it faces the lowermost wafer W to image the wafers W in the given area. In this case, the wafers W may be imaged one at a time. Alternatively, however, an imaging area S of the imaging device 4 may be set up so that the plurality of (e.g., three) wafers W can be imaged as illustrated in FIG. 4 in consideration of imaging efficiency.

Then, when the imaging device 4 completes the imaging of all the wafers W or each time the imaging device 4 completes the imaging, the image processing section 6 performs image processing, thus terminating the detection of the storage state of the wafers W in the wafer storing container 1.

Figure 5:
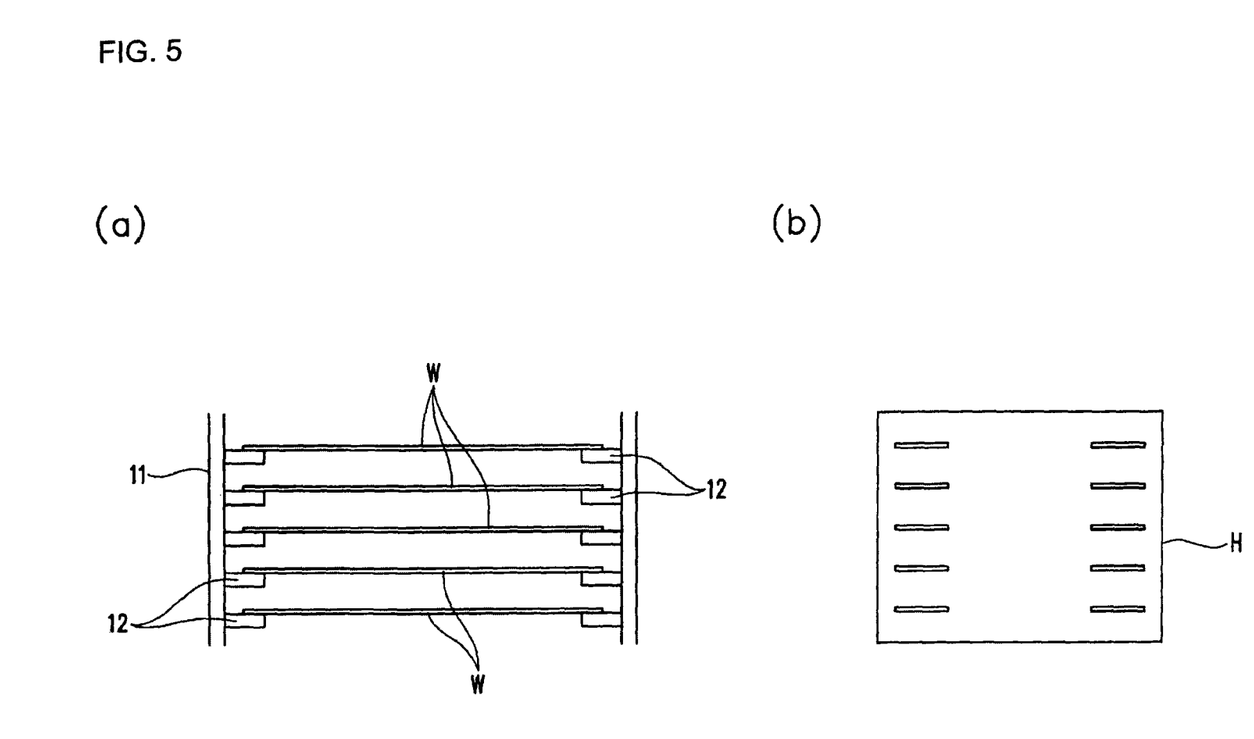
FIG. 5(a) is a front view illustrating a proper storage state of wafers.
FIG. 5(b) is a view illustrating an image obtained by imaging the proper state shown in FIG. 5(a).
Figure 6:
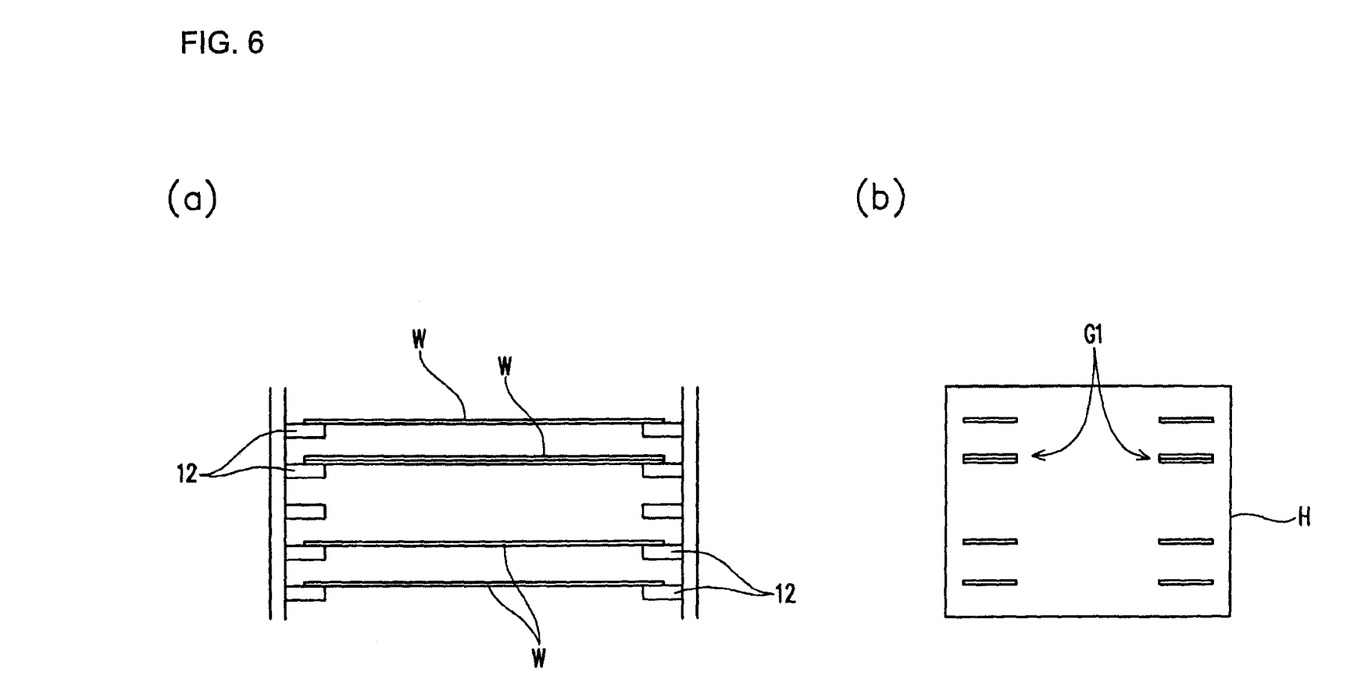
FIG. 6(a) is a front view illustrating a plurality of wafers stacked one on top of the other.
FIG. 6(b) is a view illustrating an image obtained by imaging the stacked wafers shown in FIG. 6(a).
Figure 7:
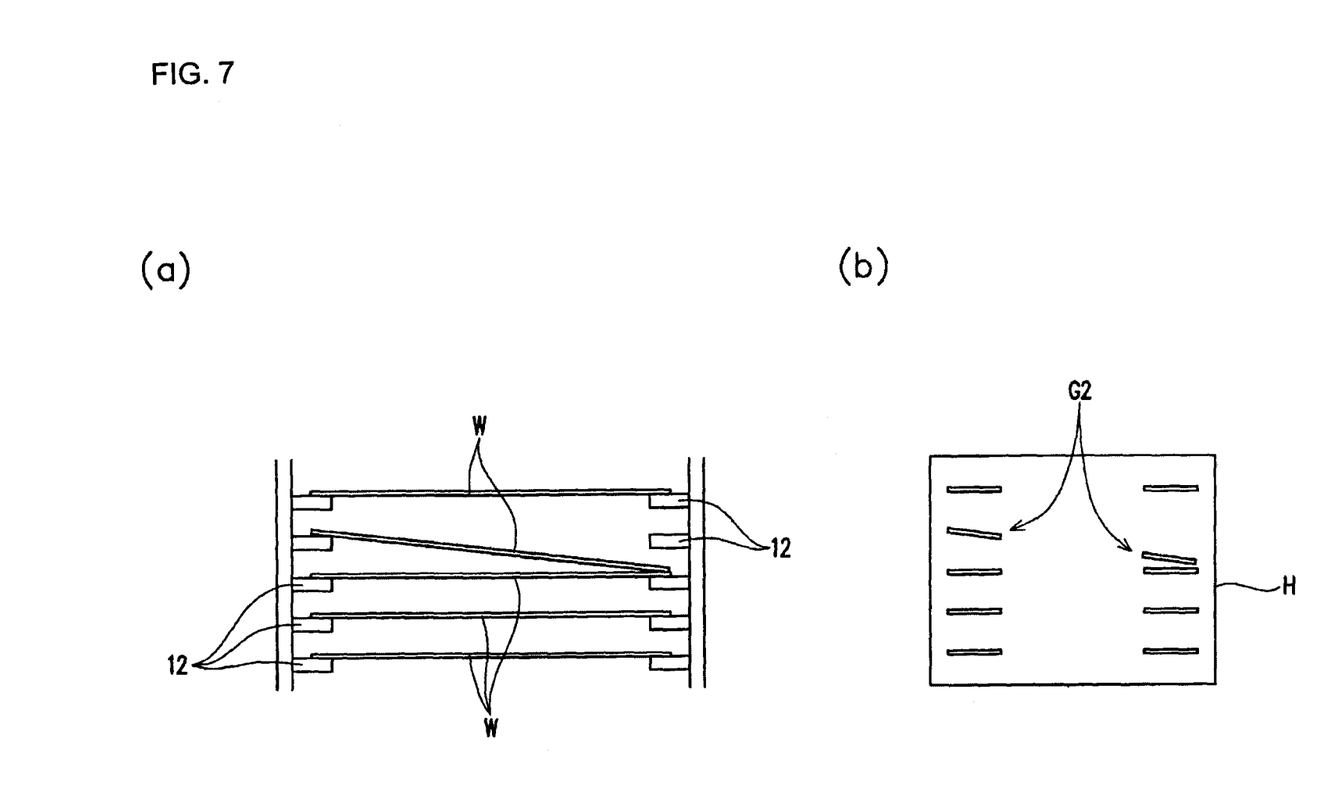
FIG. 7(a) is a front view illustrating a cross-slotted wafer.
FIG. 7(b) is a view illustrating an image obtained by imaging the cross-slotted wafer shown in FIG. 7(a).

FIGS. 5 to 7 illustrate the detection results of the storage state of the wafers W.

FIG. 5(b) illustrates an image captured when the wafers W are stored properly as illustrated in FIG. 5(a), with the image showing only the left and right edge surfaces of each of the wafers W appearing on a display screen H.

FIG. 6(b) illustrates a captured image G1 showing the absence of a wafer in the third slot 12 and the two stacked wafers W (stacking of a plurality of wafers) in the second slot 12 as illustrated in FIG. 6(a), with the image showing only the left and right edge surfaces of each of the wafers W appearing on the display screen H. Being vertically long, the illumination device can shine light on the wafers W from above and below, thus making it possible to positively detect a plurality of wafers stacked one on top of the other and display the captured image G1.

FIG. 7(b) illustrates a captured image G2 showing the wafer W whose right edge portion, which is supposedly in the second slot 12, is in the third slot 12, i.e., a so-called cross-slotted wafer as illustrated in FIG. 7(a), with the image showing only the left and right edge surfaces of each of the wafers W appearing on the display screen H. Because the image of the left and right edges of the wafers is loaded, the image shows that the wafer has its two ends located at significantly different vertical positions (or inclined at significantly different horizontal angles), thus making it possible to positively detect a cross-slotted wafer and display the captured image G2.

If the illumination devices 3 are arranged, one on the right side and another on the left side of the load port 2, as described above with light shined diagonally at an angle of about 60 degrees (any angle is acceptable) with respect to the front side of the load port 2, and if, for example, the enclosure 11 of the wafer storing container 1 is rectangular, there is the following advantage. That is, when the illumination devices 3 shine light, part of the light reaches a wall surface 11A of the enclosure 11 and is reflected rather than striking the wafer W. However, this reflected light never enters the imaging device 4 that is not opposed to the wall surface 11A of the enclosure 11. As a result, there is no likelihood that the wafer W cannot be imaged, thus allowing for positive imaging of the wafer W.

Figure 8:
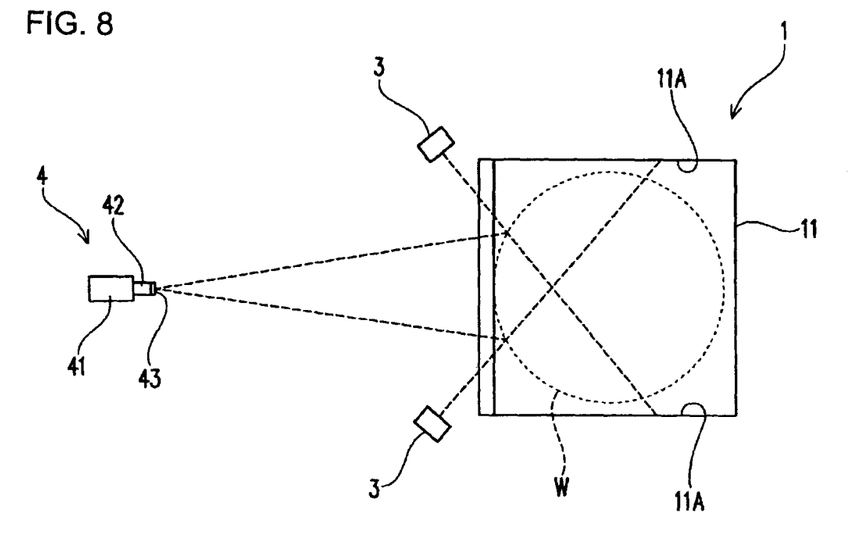
FIG. 8 is a plan view illustrating the imaging of a wafer in a rectangular wafer storing container.
Figure 9:
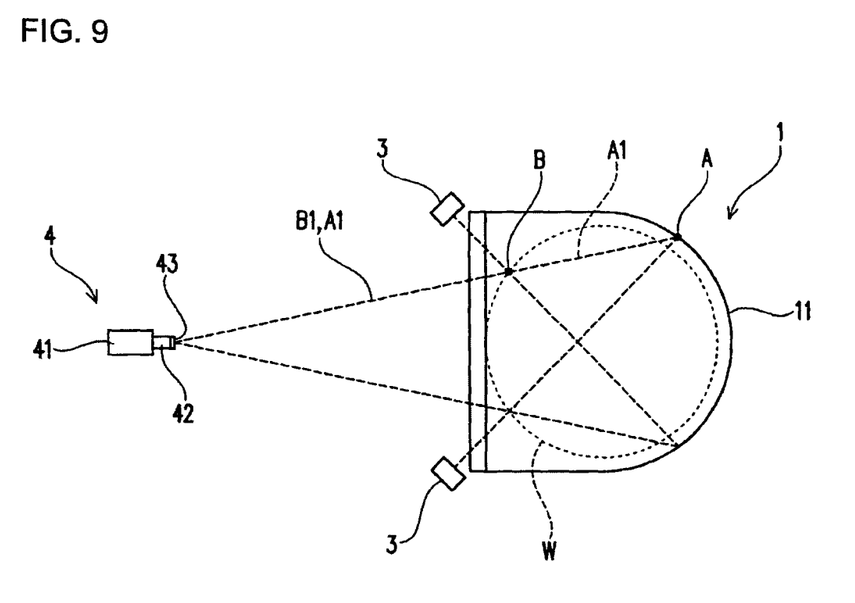
FIG. 9 is a plan view illustrating the imaging of a wafer in a circular wafer storing container.

On the other hand, if the enclosure 11 shown in FIG. 8 has a curved surface, light originating from one of the illumination devices 3 (lower illumination device 3 in the figure) is reflected at a point A of the curved surface as illustrated in FIG. 9. A reflected light beam A1 from the point A merges with a light beam B1 originating from the other illumination device 3 (upper illumination device 3 in the figure) and reflected at a point B of the edge surface of the wafer W, entering the imaging device 4 together and making it impossible to display a correct image of the wafer W. In this case, if the imaging is performed twice by causing the two illumination devices 3 to shine light alternately, the two light beams A1 and B1 never merge together and enter the imaging device 4, thus allowing for positive imaging of the wafer W. It should be noted that it is possible to keep the increase in processing time resulting from performing the imaging twice to a minimum by using fast-responding elements such as LEDs in the illumination devices 3.

Figure 10:
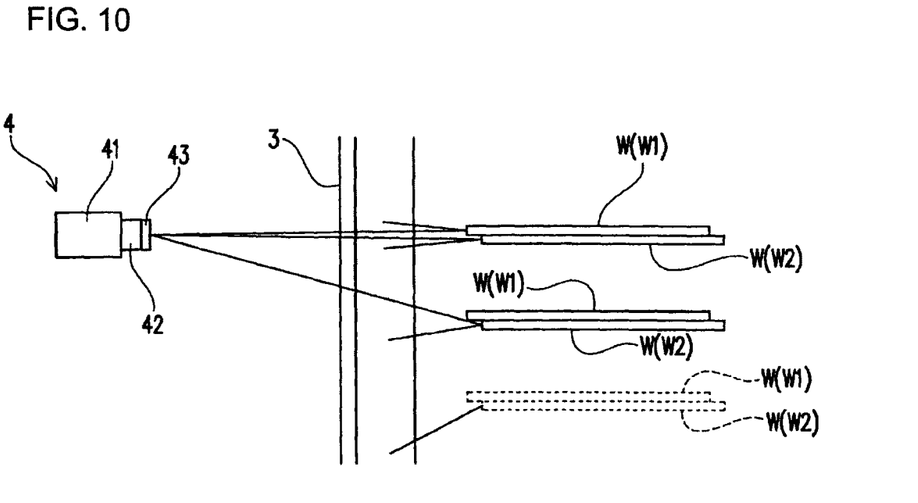
FIG. 10 is a side view illustrating the imaging of two wafers stacked one on top of the other when the upper wafer has moved and is more forward than the lower wafer.

Further, FIG. 10 illustrates a case in which the two wafers are stacked one on top of the other and, moreover, each of the upper wafers W1 is more forward than each of the lower wafers W2. Furthermore, this state manifests itself vertically in a consecutive fashion (three consecutive vertical locations in FIG. 10). Even in this case, it is possible to positively shine light on all the edge surfaces of the three pairs of wafers W that are stacked one on top of the other at three locations in FIG. 10 from above and below, thus making it possible to positively image the edge surfaces of all the wafers W1 and W2 with the imaging device 4 even if all the pairs of wafers W1 and W2 are stacked at all the locations as shown in FIG. 10. In FIG. 10, the imaging device 4 has a view angle that permits imaging of the edge surfaces of the two pairs of wafers W1 and W2 stacked one on top of the other at two locations that are shown by solid lines. Therefore, the imaging device 4 images the pair of wafers W1 and W2 shown by dashed lines after imaging the edge surfaces of the two pairs of wafers W1 and W2 that are stacked one on top of the other at two locations first and then rising or lowering (actually lowering) to the position where the pair of wafers W1 and W2 shown by dashed lines is in the view angle of the imaging device 4. Performing detection a plurality of times with the imaging area per imaging operation limited as described above prevents possible errors in the detection of wafer heights when all the wafers are imaged, for example, by a single imaging operation.

It should be noted that the present disclosure is not limited to the above embodiment but may be modified in various ways without departing from the scope of the present disclosure.

While the infrared LED elements 32 are used in the illumination devices 3 in the above embodiment, incandescent lamps or other types of light sources adapted to shine near-infrared light may be used instead. Alternatively, a vertically long fluorescent lamp may be used. On the other hand, the infrared LED elements 32 used in the illumination devices 3 and the filter 43 attached to the imaging device 4 to block visible light contribute to reduced impact of external light interference that may find its way into the wafer storing container 1. This makes it possible to reduce light of fluorescent lamps used as indoor lighting in clean rooms of semiconductor plants to a level almost trivial for imaging. However, there is a case in which, in the presence of external light interference including near-infrared light such as sunlight, the filter 43 cannot remove external light interference. In this case, a light-shielding plate adapted to shield external light interference may be provided on the opposite side of the imaging device 4 with the wafer storing container 1 sandwiched therebetween. Further, an elevating mechanism adapted to raise or lower the light-shielding plate as necessary may also be provided. That is, the light-shielding plate may be used in the following manner. In the absence of the wafer storing container 1, the light-shielding plate is lowered by the elevating mechanism to accommodate the same plate in the transfer table 21. After the wafer storing container 1 is transferred onto the transfer table 21 and before the imaging device 4 initiates the imaging, the light-shielding plate is raised by the elevating mechanism to project upward from the transfer table 21 so as to block external light interference. A non-transparent metallic or resin plate can be, for example, used as the light-shielding plate. However, using a material adapted to pass visible light that can be blocked by the filter 43 and block near-infrared light that passes through the filter 43 allows for visual inspection of the wafers W in the load port 2 and wafer storing container 1 from the outside through the light-shielding plate in a manner immune to external light interference.

Further, while the illumination devices 3 are vertically long so as to shine light over the total height of the wafer storing container 1 in the above embodiment, illumination devices may be used that shine light only on a given vertical area of the wafer storing container 1. In this case, an elevating mechanism is provided to raise or lower the illumination devices in synchronism with the rising or lowering of the imaging device 4.

Still further, while the two illumination devices 3 are provided, one on the right side and another on the left side, to capture two images of the left and right edge surfaces of the wafers W for enhanced reliability in the above embodiment, only one illumination device may be provided either on the left or right side in some cases. In these cases, the inclination of the wafers W shown in FIG. 7(b) can be detected by imaging the right sides thereof. As a result, it is possible to determine whether any of the wafers W is cross-slotted. Alternatively, three or more illumination devices may be provided for further enhanced reliability. In this case, if the illumination devices hinder the unloading of the wafers W, a transfer mechanism is provided to move the illumination devices out of the way. It should be noted that if the wafer storing container 1 is transferred from above the load port 2 by using, for example, an overhead travelling carrier, there is no need to accommodate the light-shielding plate in the transfer table 21.

Still further, while the imaging device 4 is attached to the carrier robot 5 in the above embodiment, the imaging device 4 may be provided on an elevating mechanism different from the carrier robot 5.

Still further, while the single imaging device 4 is provided in the above embodiment, a plurality of imaging devices may be provided.

Still further, while a case is shown in which the optical axis of the imaging device 4 is level in the above embodiment, the optical axis thereof may point upward or downward. When the optical axis is set up to point upward or downward, there is no likelihood that intense external light interference which cannot be sufficiently blocked by the filter 43 and which finds its way through the enclosure 11 may not enter the imaging device 4 together with reflected light from the wafer edges, thus contributing to further enhanced reliability in the wafer detection. It should be noted that the range of angles at which the optical axis is set up to point downward or upward is that at which, even if the upper one of the two wafers, stacked one on top of the other as described above, has moved and is more forward than the lower one, the edge surface of the lower wafer can still be detected.

EXPLANATION OF REFERENCE SYMBOLS

1 . . . Wafer storing container, 2 . . . Load port, 3 . . . Illumination devices, 4 . . . Imaging device, 5 . . . Carrier robot, 6 . . . Image processing section, 11 . . . Enclosure, 12 . . . Slots, 13 . . . Lid, 21 . . . Transfer table, 22 . . . Opening/closing section, 31 . . . Casing, 32 . . . Infrared LED elements, 33 . . . Light-diffusing plate, 41 . . . Camera, 42 . . . Lens, 43 . . . Filter, 51 . . . Hand, 52, 53 . . . Telescopic arms, 54 . . . Elevating shaft, W . . . Wafers

What is claimed is:

1. A wafer detecting apparatus for detecting storage states of a plurality of wafers stored in a wafer container, the plurality of wafers being stored substantially horizontal in slots in the wafer container and being transferred in and out through a front opening of the wafer container, the wafer detecting apparatus comprising:
   an illumination device configured to emit light, through the front opening, onto the plurality of wafers stored in the wafer container from above and below each of the plurality of wafers, the illumination device extending in a vertical direction and the illumination device being arranged on one of left and right sides of the wafer container; and
   an imaging device configured to receive the light reflected from the plurality of wafers, the imaging device being arranged substantially directly in front of the wafer container.

2. The wafer detecting apparatus according to claim 1, wherein
   the illumination device vertically extends for a length that substantially covers all of the plurality of wafers.

3. The wafer detecting apparatus according to claim 1, wherein
   the imaging device receives light reflected from side edges of the plurality of wafers.

4. The wafer detecting apparatus according to claim 1, further comprising:
   a second illumination device configured to emit light through the front opening onto the plurality of wafers stored in the wafer container from above and below each of the plurality of wafers, the second illumination device extending in a vertical direction and being arranged on a side that is opposite to the one of left and right sides of the wafer container.

5. The wafer detecting apparatus according to claim 4, wherein
   the imaging device receives light reflected from right and left side edges of the plurality of wafers.

6. The wafer detecting apparatus according to claim 4, wherein
   the illumination device and the second illumination device alternatively emit light.

7. The wafer detecting apparatus according to claim 1, wherein
   the illumination device is arranged in a vicinity of the front opening of the wafer container, and the illumination device extends from a top to a bottom of the wafer container.

8. The wafer detecting apparatus according to claim 1, wherein the illumination device is arranged on a load port which is configured to open or close a lid of the wafer container.

9. The wafer detecting apparatus according to claim 1, wherein
   the illumination device includes,
      a plurality of LEDs arranged in a vertical direction, and
      a light diffuser configured to diffuse light from the plurality of LEDs.

10. The wafer detecting apparatus according to claim 9, wherein
    the LEDs are configured to emit infrared light.

11. The wafer detecting apparatus according to claim 10, further comprising:
    a filter, arranged between the plurality of wafers and the imaging device, configured to filter-out light other than infrared light.

12. The wafer detecting apparatus according to claim 1, further comprising:
    a vertical transport mechanism configured to move the imaging device in a vertical direction.

13. A wafer transfer system comprising:
    a combination of an illumination device and an imaging device for detecting storage states of a plurality of wafers stored in a wafer container, the plurality of wafers being stored substantially horizontal in slots in the wafer container and being transferred in and out through a front opening of the wafer container,
    the illumination device being configured to emit light, through the front opening, onto the plurality of wafers stored in the wafer container from above and below each of the plurality of wafers, the illumination device extending in a vertical direction, and the illumination device being arranged on one of left and right sides of the wafer container, and
    the imaging device being configured to receive the light reflected from the plurality of wafers, and arranged substantially directly in front of the wafer container;
    a load port configured to open or close a lid of the wafer container; and
    a carrier robot configured to unload the wafers from the wafer container and reload the wafers back into the wafer container.

14. The wafer transfer system according to claim 13, wherein the illumination device is arranged adjacent to the front opening of the wafer container, the front opening being placed on the load port.

15. The wafer transfer system according to claim 13, wherein
    the carrier robot comprises a hand configured to grab the wafer, and
    the imaging device is attached to the carrier robot.

16. A load port configured to open or close a lid of a wafer container, comprising:
    an illumination device which is configured to emit light, through a front opening of the wafer container, onto a plurality of wafers stored in the wafer container from above and below each of the plurality of wafers, the illumination device extending in a vertical direction, and the illumination device being arranged on one of left and right sides of the wafer container.

17. The load port according to claim 16, wherein the illumination device is arranged adjacent to the front opening of the wafer container, the front opening being placed on the load port.

* * * * *